(12) United States Patent
Kobrin et al.

(10) Patent No.: US 9,116,430 B2
(45) Date of Patent: Aug. 25, 2015

(54) PLASMONIC LITHOGRAPHY USING PHASE MASK

(71) Applicant: Rolith, Inc., Pleasanton, CA (US)

(72) Inventors: Boris Kobrin, Pleasanton, CA (US); Edward Barnard, Redwood City, CA (US)

(73) Assignee: Rolith, Inc., Pleasanton, CA (US)

( * ) Notice: Subject to any disclaimer, the term of this patent is extended or adjusted under 35 U.S.C. 154(b) by 0 days.

(21) Appl. No.: 14/229,762

(22) Filed: Mar. 28, 2014

(65) Prior Publication Data

US 2015/0177619 A1   Jun. 25, 2015

Related U.S. Application Data

(63) Continuation of application No. PCT/US2012/057590, filed on Sep. 27, 2012.

(60) Provisional application No. 61/541,947, filed on Sep. 30, 2011.

(51) Int. Cl.
| | |
|---|---|
| *G03F 7/26* | (2006.01) |
| *G03F 7/20* | (2006.01) |
| *G03F 1/00* | (2012.01) |
| *G03F 7/00* | (2006.01) |

(52) U.S. Cl.
CPC .. *G03F 7/20* (2013.01); *G03F 1/00* (2013.01); *G03F 7/0035* (2013.01)

(58) Field of Classification Search
CPC .......... G03F 1/26; G03F 1/80; G03F 7/70325
USPC ....................................... 430/5, 322
See application file for complete search history.

(56) References Cited

U.S. PATENT DOCUMENTS

| | | | |
|---|---|---|---|
| 4,767,723 A * | 8/1988 | Hinsberg et al. | 438/160 |
| 8,182,982 B2 | 5/2012 | Kobrin | |
| 8,192,920 B2 | 6/2012 | Kobrin | |
| 8,318,386 B2 | 11/2012 | Kobrin | |
| 8,334,217 B2 | 12/2012 | Kobrin | |
| 8,425,789 B2 | 4/2013 | Kobrin | |
| 8,450,160 B2 * | 5/2013 | Hong et al. | 438/160 |
| 8,518,633 B2 | 8/2013 | Kobrin et al. | |

* cited by examiner

*Primary Examiner* — Caleen Sullivan
(74) *Attorney, Agent, or Firm* — Joshua D. Isenberg; JDI Patent

(57) ABSTRACT

In the proposed plasmonic nanolithography technique a transparent mask is brought into physical contact with a metal on a substrate that is coated with a photoresist. The mask is not made of metal or other material that supports surface plasmons. The metal layer is exposed to radiation of a characteristic vacuum wavelength through the mask and the photoresist or through the substrate. The mask features and the vacuum wavelength of the radiation are chosen so that the radiation excites surface plasmons at the interface between the metal and the photoresist. The excitation of surface plasmons allows for the exposure and generation of features which are well-below the free space diffraction limit and small compared to the size of the features in the mask.

16 Claims, 3 Drawing Sheets

PLASMONIC LITHOGRAPHY USING PHASE MASK

PRIORITY CLAIMS

This application is a continuation of International Application No. PCT/US2012/057590, filed Sep. 27, 2012 to Boris Kobrin, the entire contents of which are incorporated herein by reference. International Application No. PCT/US2012/057590 claims the benefit of U.S. Provisional Application No. 61/541,947, filed Sep. 20, 2011 to Boris Kobrin, the entire contents of which are incorporated herein by reference.

FIELD OF THE INVENTION

Embodiments of the invention relate to photolithography and more particularly to plasmonic lithography which employs metallic nanostructures to manipulate the flow of light and exposure of a photoresist.

BACKGROUND

This section describes background subject matter related to the disclosed embodiments of the present invention. There is no intention, either expressed or implied, that the background art discussed in this section legally constitutes prior art.

Nanostructuring is necessary for many present applications and industries and for new technologies and future advanced products, such as wire grid polarizers for flat panel displays or architectural glass. Nanostructured substrates may be fabricated using techniques such as e-beam direct writing, deep UV lithography, nanosphere lithography, nanoimprint lithography, near-field phase shift lithography, and plasmonic lithography, for example.

A method of nanopatterning large areas of rigid and flexible substrate materials based on near-field optical lithography is described in International Patent Application Publication WO2009094009 and U.S. Patent Application Publication US20090297989, both of which are incorporated herein by reference. In this technique, a rotatable mask is used to controllably expose a radiation-sensitive material. Typically the rotatable mask comprises a cylinder or cone. The nanopatterning technique makes use of near-field photolithography, where the mask used to pattern the substrate is in contact with the substrate. Near-field photolithography may make use of an elastomeric phase-shifting mask, or may employ surface plasmon technology, where a rotating cylinder surface comprises metal nano holes or nanoparticles. In one implementation such a mask is a near-field phase-shift mask. Near-field phase shift lithography involves exposure of a photoresist layer to ultraviolet (UV) light that passes through an elastomeric phase mask while the mask is in conformal contact with a photoresist. Bringing an elastomeric phase mask into contact with a thin layer of photoresist causes the photoresist to "wet" the surface of the contact surface of the mask. Passing UV light through the mask while it is in contact with the photoresist exposes the photoresist to the distribution of light intensity that develops at the surface of the mask. A phase mask is formed with a depth of relief that is designed to modulate the phase of the transmitted light by $\pi$ radians. As a result of the phase modulation, a local null in the intensity appears at step edges in the relief pattern formed on the mask. When a positive photoresist is used, exposure through such a mask, followed by development, yields a line of photoresist with a width equal to the characteristic width of the null in intensity. For 365 nm (near UV) light in combination with a conventional photoresist, the width of the null in intensity is approximately 100 nm. A PDMS mask can be used to form a conformal, atomic scale contact with a layer of photoresist. This contact is established spontaneously upon contact, without applied pressure. Generalized adhesion forces guide this process and provide a simple and convenient method of aligning the mask in angle and position in the direction normal to the photoresist surface, to establish perfect contact. There is no physical gap with respect to the photoresist. PDMS is transparent to UV light with wavelengths greater than 300 nm. Passing light from a mercury lamp (where the main spectral lines are at 355-365 nm) through the PDMS while it is in conformal contact with a layer of photoresist exposes the photoresist to the intensity distribution that forms at the mask.

Another implementation of the mask may include surface plasmon technology in which a patterned metal layer or film is laminated or deposited onto the outer surface of a mask. The metal layer or film has a specific series of through nanoholes. In another embodiment of surface plasmon technology, a layer of metal nanoparticles is deposited on the transparent mask's outer surface, to achieve the surface plasmons by enhanced nanopatterning.

Unfortunately, it is difficult to laminate or deposit metal onto a mask made of elastomeric materials such as polydimethyl siloxane (PDMS).

It is within this context that embodiments of the present invention arise.

SUMMARY

Embodiments of the present invention address the problem of plasmonic printing using an elastomeric phase mask. Instead of coating the mask with metal, an underlying transparent substrate is coated with a blanket layer of metal. The metal layer is then coated with a photoresist. A non-metallic phase mask having a pattern of features with a characteristic spatial period is placed against the photoresist. Instead of exposing the photoresist to radiation through a metal mask, the metal layer is then exposed to radiation of a characteristic vacuum wavelength through the transparent substrate. In some embodiments, the resist and metal layer may be exposed to the radiation through the non-metallic mask provided the resist layer is sufficiently thin and/or transparent. Either way, the spatial period of the mask features and the vacuum wavelength of the radiation can be chosen so that the radiation excites surface plasmons at the interface between the metal and the photoresist. The surface plasmons have a characteristic wavelength equal to the period of the surface features.

The spatial period of variation in the electric field of the surface plasmons is the same as the characteristic wavelength of the surface plasmons. However, the spatial period of variation of intensity of the surface plasmons is proportional to the square of the electric field. As a result the spatial period of variation of intensity distribution produced by two counter-propagating surface plasmons is half the wavelength of the surface plasmons and can equal half the spatial period of features in a mask that launches the counter-propagating surface plasmons.

Embodiments of the present invention pertain to methods useful in fabrication of near-field optical lithography masks for "Rolling mask" lithography. A cylindrical mask is coated with a polymer, which is patterned with desired features in order to obtain a mask for phase-shift lithography or plasmonic lithography. The polymer (e.g., an elastomer) may be patterned before or after being disposed on the cylinder surface.

DETAILED DESCRIPTION

As a preface to the detailed description, it should be noted that, as used in this specification and the appended claims, the singular forms "a", "an", and "the" include plural referents, unless the context clearly dictates otherwise.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," "above", "below", etc., is used with reference to the orientation of the figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
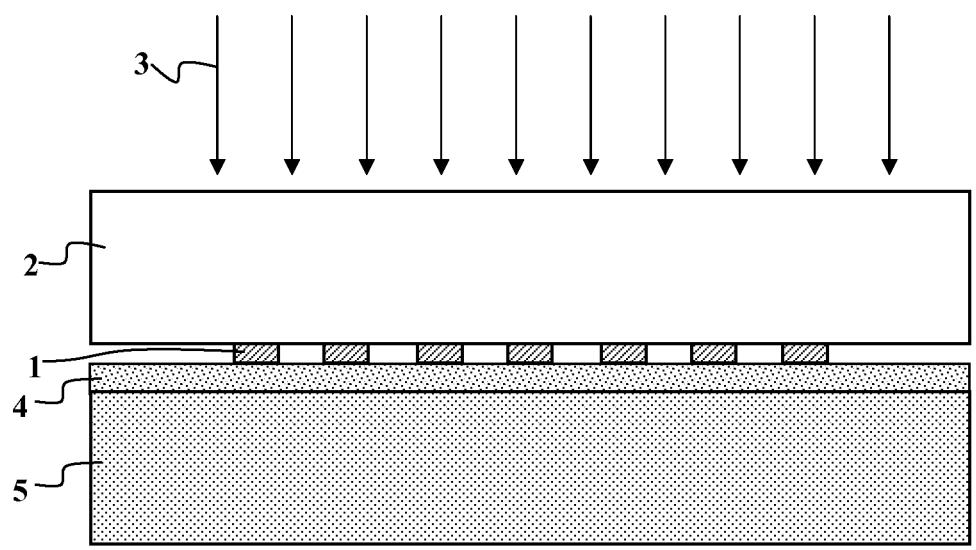
FIG. 1 is a schematic diagram illustrating conventional surface plasmon resonant interference nano lithography.

Differences between the conventional plasmon resonant nanolithography and embodiments of the present invention may be appreciated by comparing FIG. 1 to FIGS. 2A-2C. FIG. 1 illustrates conventional plasmon resonant nanolithography process.

As shown in FIG. 1, a metallic mask 1 with a plurality of features may be fabricated on a thin quartz substrate 2. Incident radiation 3 of wavelength λ flows through the mask 1 and illuminates a photoresist layer 4 formed on an underlying substrate 5, which traditionally is an insulator or semiconductor. In traditional photolithography, this would be a typical diffraction limited exposure and features smaller than approximately λ/2 normally could not be realized. However, the resonant excitation of surface electromagnetic waves on the metallic surfaces (known as surface plasmons) provides a way to get around the diffraction limit.

The basic principle of plasmon resonant interference nanolithography is based on the idea that with the aid of a periodic or non-periodic corrugation or a prism, illumination light can couple with surface plasmons (SPs) to obtain a new state also often referred to as a surface plasmon polariton (SPP), which has high field intensity at a metal surface and can exhibit a much shorter wavelength compared to that of illuminating radiation. The periodicity of the SPP can be smaller than the periodicity Λ of the mask 1 that induces excitation of the SPPs. The interference of SPPs propagating in opposite directions can result in a strongly enhanced nanoscale spatial distribution of an electrical field near the metal surface. Because the intensity of the SPP depends on the square of the electrical field the photoresist 4 can be subjected to an intensity distribution pattern with an even smaller periodicity than that of SPP waves.

According to the theory of surface plasmon optics for given materials, the resonant plasmon wavelength $\lambda_{plasmon}$ for the weak corrugation limit and normal incidence radiation, can be expressed as $$\lambda_{plasmon} = \Lambda = \lambda_0 \bigg/ \sqrt{\left(\frac{\varepsilon_m \varepsilon_d}{\varepsilon_m + \varepsilon_d}\right)}.$$

Here, Λ is a spatial periodicity in the mask pattern, ω is the resonant frequency, $\varepsilon_m$ is the frequency-dependent dielectric constant of the metal, $\varepsilon_d$ is the dielectric constant of the adjacent dielectric. For a mask of deep corrugation, the resonant condition of light leaving a structured mask in contact with a substrate varies with the parameters of its structures and the details of the implementation.

As noted above, the disadvantage of the technique shown in FIG. 1 is that it is difficult to fabricate a metal mask on many types of mask materials used for phase masks. In particular, it is difficult, indeed it is often impossible, to fabricate a metal mask on a substrate made of an elastomer material such as PDMS. Moreover, a metal layer deposited on nanoscale patterned phase mask may change features dimensions and shape, which is undesirable. Also, metal material covering elastomeric mask makes it less "sticky" and may lead to a slippage problem during a dynamic exposure process. To overcome this disadvantage, embodiments of the present invention utilize a phase mask having a mask pattern that is not made of metal. Another technique used in the past, depositing metal layer on top of photoresist material, is not desirable due to possibility of affecting photoresist sensitivity, surface smoothness and slippage problems outlined above.

Figure 2A:
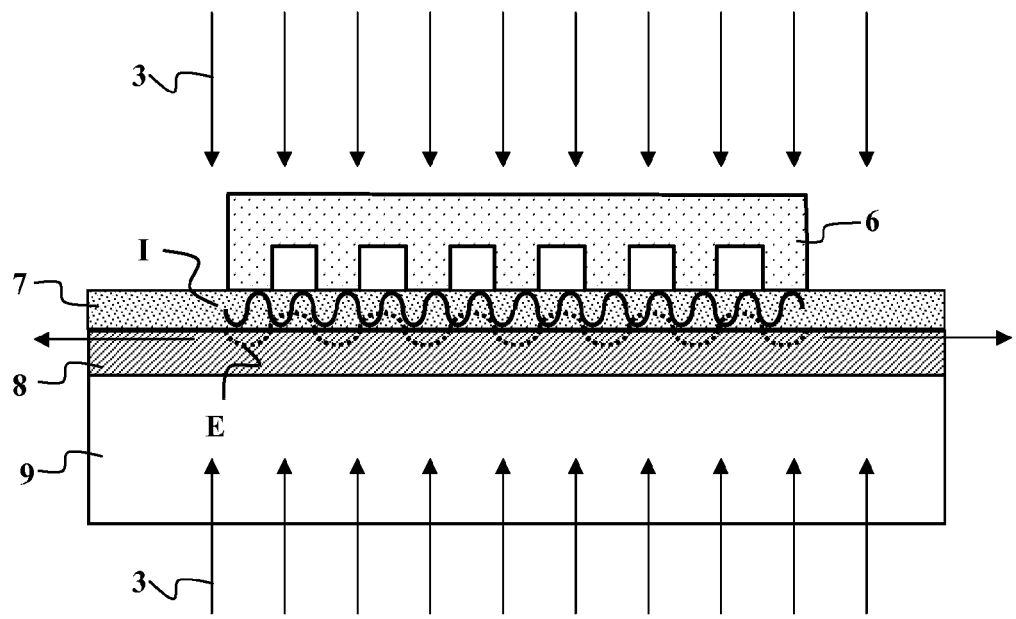
FIGS. 2A-2C are a sequence of schematic diagrams illustrating surface plasmon resonant interference nanolithography in accordance with an embodiment of the present invention.
Figure 2B:
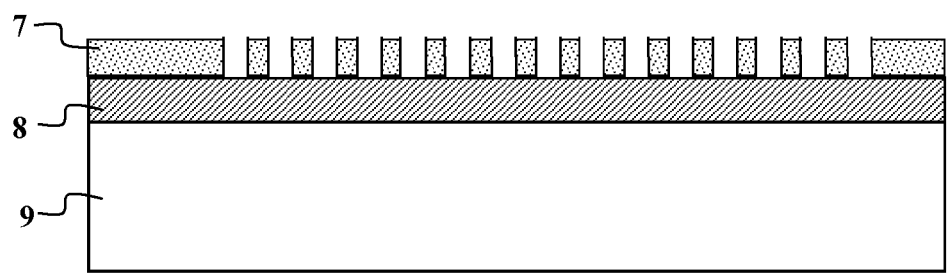
Figure 2C:
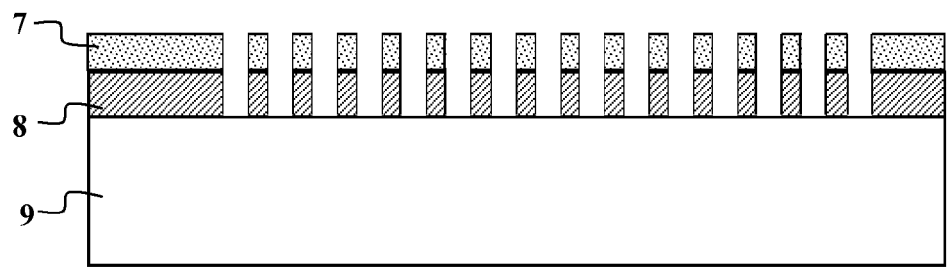

FIGS. 2A-2C illustrate surface plasmon resonant interference nanolithography in accordance with an embodiment of the present invention. As shown in FIG. 2A, a transparent mask 6 may have a pattern of corrugated features of periodicity Λ and width w. The mask 6 may be made of any suitable transparent material. However, the transparent mask 6 is not made of metal or other material that supports surface plasmons. In other words, the mask 6 is made of a material that does not support surface plasmons. By way of example, and not by way of limitation, the mask 6 may be made, e.g., of an elastomer material, such as PDMS. A mask made of an elastomer material is sometimes referred to as a "softmask" or "soft mask". By way of example, and not by way of limitation, the features may be a pattern of evenly spaced parallel lines. Alternatively, the mask 6 may include a two-dimensional pattern of corrugated features.

A thin layer of photoresist 7 is formed on a blanket layer of metal 8 that overlies a substrate 9. The photoresist 7 may be extremely thin, e.g., a few nanometers thick. By way of example, such a thin layer may be deposited by atomic layer deposition (ALD) or chemical vapor deposition (CVD). Alternatively, such layers cold be self-assembled monolayers (SAMs) deposited from a liquid or vapor phase. The photoresist is illuminated by radiation 3 of wavelength λ through the mask 6. If the photoresist layer is sufficiently thin, the radiation 3 may excite surface plasmons 10 in opposite directions in the metal layer. As noted above, the surface plasmons have a characteristic spatial period $\lambda_{plasmon}$ that depends on the material properties of the metal layer 8, photoresist 7, and mask 6 and the spatial period Λ of the features in the mask 6.

In an alternative embodiment, the metal layer may 8 be illuminated through the substrate 9 to excite the surface plasmons 10 in the metal layer, if the substrate is sufficiently thin and/or transparent to the radiation 3.

The surface plasmons 10 interfere and produce a pattern of varying electric field E having a characteristic spatial period that can be less than the spatial period Λ of the features in the mask 6. The corresponding pattern of varying intensity I has a spatial period Λ' that is about half the spatial period of the plasmonic electric field. The result is a pattern of exposure in the photoresist 7 characterized by the spatial period Λ' of the intensity distribution.

By way of example, and not by way of limitation, the incident wavelength may be in a range from about 100 nm to about 500 nm, the mask periodicities may range from about 50 nm to about 1 micrometer, and the linewith of the features in the mask may range from about 25 nm to 500 nanometer.

The exposed photoresist 7 may be developed, as shown in FIG. 2B. After developing, the resist has a pattern of features of periodicity Λ' and width w' that are significantly smaller than the periodicity Λ and width w of the features in the mask 6. The pattern in the photoresist can be transferred to the metal layer 8, by a suitable etch process as shown in FIG. 2C. If desired, the patterned metal layer 8 may be used as a mask for etching of the substrate 9.

Although the foregoing examples have been described in which a mask has periodic features, embodiments of the present invention are not limited to such examples. Alternatively, the mask may have a pattern characterized by arbitrarily-shaped, aperiodic features.

Furthermore, in alternative embodiments, the metal layer 8 may be patterned with features (either periodic or aperiodic features) before it is coated with the photoresist 7. When the metal layer is illuminated by the radiation 3 (either through the mask 6 or through the substrate 9) the combined effects of the features in the mask 6 together with the features in the metal layer 8 would determine the pattern of exposure of the resist.

Figure 3:
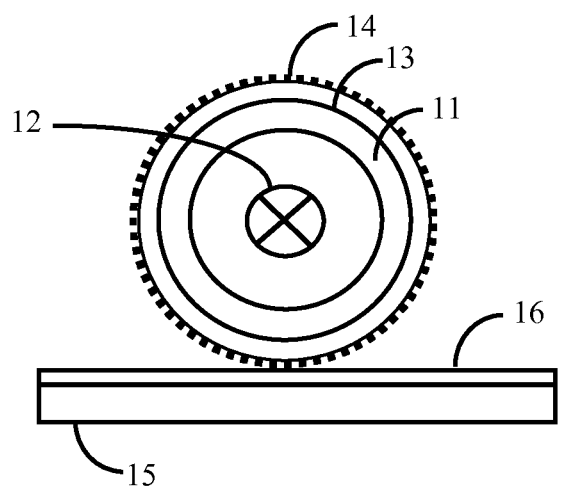
FIG. 3 is a schematic diagram illustrating the use of a "Rolling Mask" lithography system to implement plasmon resonant interference nanolithography in accordance with an embodiment of the present invention.

Embodiments of the present invention may be used in conjunction with a type of lithography known as "rolling mask" nanolithography. An example of a "rolling mask" near-field nanolithography system is described in International Patent Application Publication Number WO2009094009, which is incorporated herein by reference. An example of such a system is shown in FIG. 3. The "rolling mask" may be in the form of a glass (quartz) frame in the shape of hollow cylinder 11, which contains a light source 12. An elastomeric film 13 laminated on the outer surface of the cylinder 11 has a nanopattern 14 fabricated in accordance with the desired pattern. The nanopattern 14 can be designed to implement phase-shift exposure, and in such case is fabricated as an array of nanogrooves, posts or columns, or may contain features of arbitrary shape. The nanopattern on the rolling mask can have features ranging in size from about 1 nanometer to about 100 microns, preferably from about 10 nanometers to about 1 micron, more preferably from about 50 nanometers to about 500 nanometers. The rolling mask can be used to print features ranging in size from about 1 nanometer to about 1000 nanometers, preferably about 10 nanometers to about 500 nanometers, more preferably about 50 nanometers to about 200 nanometers.

The rolling mask is brought into a contact with a substrate 15 coated with photosensitive material 16, such as a photoresist. The photosensitive material 16 is exposed to radiation from the light source 12 and the pattern on the cylinder is transferred to the photosensitive material at the place where the nanopattern contacts the photosensitive material. The substrate 15 is translated as the cylinder rotates such that the nanopattern 14 remains in contact with the photosensitive material.

While the above is a complete description of the preferred embodiments of the present invention, it is possible to use various alternatives, modifications, and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A" or "An" refers to a quantity of one or more of the item following the article, except where expressly stated otherwise. The appended claims are not to be interpreted as including means-plus-function limitations, unless such a limitation is explicitly recited in a given claim using the phrase "means for". Any element in a claim that does not explicitly state "means for" performing a specified function, is not to be interpreted as a "means" or "step" clause as specified in 35 USC §112, ¶6.

What is claimed is:

1. A method for plasmonic printing using a transparent mask, comprising:
   coating a metal layer on a substrate with a photoresist;
   placing a transparent mask having a pattern of mask features is placed against the photoresist, where in the transparent mask is not made of metal or other material that supports surface plasmons;
   exposing the metal layer to radiation of a characteristic vacuum wavelength through the mask and the photoresist or through the substrate, wherein the mask features and the vacuum wavelength of the radiation are configured so that the radiation excites surface plasmons at the interface between the metal and the photoresist.

2. The method of claim 1, further comprising developing the resist.

3. The method of claim 2, further comprising etching the metal layer through the developed resist to produce a pattern in the metal having a spatial period less than that of the spatial period of the mask features.

4. The method of claim 3, further comprising etching the substrate through the pattern in the metal.

5. The method of claim 1, wherein the pattern of mask features is characterized by one or more characteristic spatial periods.

6. The method of claim 5, wherein the one or more spatial periods of the mask features are configured such that the surface plasmons have a characteristic wavelengths less than or equal to one or more of the spatial periods of the mask features.

7. The method of claim 1, wherein exposing the metal layer to the radiation includes contacting the photoresist with the surface of a cylindrical mask having a pattern formed on the surface, transmitting radiation from inside the cylindrical mask through the pattern formed on the surface to the photoresist.

8. The method of claim 5, further comprising rotating the cylindrical mask, while translating the substrate and maintaining contact between the mask and the photoresist.

9. The method of claim 1, wherein the mask is a phase mask.

10. The method of claim 1, wherein the mask is a patterned elastomer.

11. The method of claim 7, wherein the mask is made of an elastomer material.

12. The method of claim 8, wherein the elastomer material is polydimethyl siloxane (PDMS).

13. The method of claim 1, wherein the metal is aluminum.

14. The method of claim 1, wherein the metal layer is characterized by a pattern of features.

15. The method of claim 14, wherein the combined effects of the features in the mask together with the pattern features in the metal layer determines a pattern of exposure of the photoresist.

16. The method of claim 1, wherein the mask is a soft mask.

* * * * *